United States Patent
Gu et al.

(10) Patent No.: US 9,941,156 B2
(45) Date of Patent: Apr. 10, 2018

(54) SYSTEMS AND METHODS TO REDUCE PARASITIC CAPACITANCE

(71) Applicant: QUALCOMM Incorporated, San Diego, CA (US)

(72) Inventors: Shiqun Gu, San Diego, CA (US); Vidhya Ramachandran, Cupertino, CA (US); Christine Sung-An Hau-Riege, Fremont, CA (US); John Jianhong Zhu, San Diego, CA (US); Jeffrey Junhao Xu, San Diego, CA (US); Jihong Choi, San Diego, CA (US); Jun Chen, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 85 days.

(21) Appl. No.: 14/676,728

(22) Filed: Apr. 1, 2015

(65) Prior Publication Data

US 2016/0293475 A1    Oct. 6, 2016

(51) Int. Cl.
*H01L 21/768* (2006.01)
*H01L 23/532* (2006.01)
*H01L 23/522* (2006.01)

(52) U.S. Cl.
CPC .... *H01L 21/7682* (2013.01); *H01L 21/76802* (2013.01); *H01L 23/5222* (2013.01); *H01L 23/5329* (2013.01); *H01L 23/53295* (2013.01)

(58) Field of Classification Search
CPC ........... H01L 21/7682; H01L 21/76802; H01L 23/5329; H01L 21/31144; H01L 21/764; H01L 23/5221; H01L 23/5222

USPC .......... 257/773, 276; 438/619, 618, 522, 50; 216/41
See application file for complete search history.

(56) References Cited

U.S. PATENT DOCUMENTS

| | | | |
|---|---|---|---|
| 6,268,277 B1 | 7/2001 | Bang | |
| 6,576,976 B2 * | 6/2003 | Lien | H01L 21/7682 257/522 |
| 6,984,577 B1 | 1/2006 | Zhao et al. | |
| 7,078,334 B1 | 7/2006 | Chowdhury et al. | |

(Continued)

FOREIGN PATENT DOCUMENTS

JP    2012033607 A    2/2012

OTHER PUBLICATIONS

International Search Report and Written Opinion for International Application No. PCT/US2016/022200, ISA/EPO, dated May 30, 2016, 13 pgs.

(Continued)

*Primary Examiner* — Mouloucoulaye Inoussa
(74) *Attorney, Agent, or Firm* — Toler Law Group, PC.

(57) ABSTRACT

Devices and methods to reduce parasitic capacitance are disclosed. A device may include a dielectric layer. The device may include first and second conductive structures and an etch stop layer proximate to the dielectric layer. The etch stop layer may define first and second openings proximate to a region of the dielectric layer between the first and second conductive structures. The device may include first and second airgaps within the region. The device may include a layer of material proximate to (e.g., on, above, or over) the etch stop layer. The layer of material proximate to the etch stop layer may cover the first and second airgaps.

16 Claims, 11 Drawing Sheets

(56) References Cited

U.S. PATENT DOCUMENTS

| | | |
|---|---|---|
| 7,642,619 B2 | 1/2010 | Matz et al. |
| 8,304,906 B2 | 11/2012 | Huang et al. |
| 2006/0084262 A1 | 4/2006 | Qin |
| 2006/0088975 A1 | 4/2006 | Ueda |
| 2007/0120263 A1 | 5/2007 | Gabric et al. |
| 2008/0122106 A1* | 5/2008 | Nitta ............... H01L 21/7682 257/773 |
| 2009/0140428 A1* | 6/2009 | Bonilla ............ H01L 21/31144 257/751 |
| 2009/0200636 A1* | 8/2009 | Edelstein ............ H01L 21/0273 257/522 |
| 2013/0228934 A1 | 9/2013 | Kim et al. |
| 2014/0008804 A1 | 1/2014 | Purayath et al. |
| 2016/0211216 A1* | 7/2016 | Xu ................... H01L 23/53219 |

OTHER PUBLICATIONS

Yoo, H.J. et al., "Demonstration of a Reliable High-Performance and Yielding Air gap Interconnect Process," 2010 International Technology Conference (IITC), 2010, pp. 1-3.

\* cited by examiner

SYSTEMS AND METHODS TO REDUCE PARASITIC CAPACITANCE

I. FIELD

The present disclosure is generally related to systems and methods to reduce parasitic capacitance and more specifically to formation of airgaps to reduce parasitic capacitance between adjacent metal interconnects.

II. DESCRIPTION OF RELATED ART

Advances in technology have resulted in smaller and more powerful computing devices. For example, there currently exist a variety of portable personal computing devices, including wireless telephones such as mobile and smart phones, tablets and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Portable computing devices, such as wireless telephones, may include semiconductor devices. As semiconductor fabrication processes evolve, a pitch (e.g., a distance) between adjacent conductive structures (e.g., metal interconnects) of a semiconductor device decreases. Decreasing a distance between adjacent metal interconnects may increase parasitic capacitance between the adjacent metal interconnects.

III. SUMMARY

An airgap located in a region (e.g., of a dielectric layer) between first and second conductive structures (e.g., back end of the line (BEOL) metal interconnects) may reduce parasitic capacitance between the first and second conductive structures. First and second airgaps may be formed between the first and second conductive structures by etching portions of dielectric material in the region through first and second openings in an etch stop layer. The first and second openings may be shaped to limit an amount of a sealing material that leaks into the first and second airgaps during airgap sealing. One particular advantage provided by at least one of the disclosed embodiments is that parasitic capacitance between the first and second conductive structures may be controlled by limiting an amount of sealing material that leaks into the first and second airgaps before the sealing material hardens.

The first and second airgaps may be separated from one another by barriers formed of one or more portions of dielectric material (within the region between first and second conductive structures) that were not etched away during formation of the first and second airgaps. The remaining dielectric material between the first and second conductive structures may prevent portions of the first and second conductive structures from exposure to air (e.g., air of the first and second airgaps) by serving as an intervening material between portions of the first and second conductive structures and the air. Limiting or preventing exposure of the portions of the first and second conductive structures to the air may reduce or prevent oxidation of unexposed portions of the first and second conductive structures. Preventing or limiting oxidation of the first and second conductive structures may improve electromigration behavior of the first and second conductive structures. Additionally, the barriers may provide structural support for overlying structures such as upper level vias.

In a particular aspect, an apparatus includes a dielectric layer, a first conductive structure, and a second conductive structure. The dielectric layer includes a region between the first and second conductive structures. The apparatus includes an etch stop layer proximate to the dielectric layer. The etch stop layer defines a first opening and a second opening that are proximate to the region between the first conductive structure and the second conductive structure. The apparatus includes a first airgap and a second airgap within the region between the first conductive structure and the second conductive structure. The apparatus includes a layer of low-k dielectric material proximate to the etch stop layer and covering the first airgap and the second airgap.

In a particular aspect, a method of fabricating a device includes forming a first opening and a second opening in an etch stop layer above a region between a first conductive structure and a second conductive structure of a semiconductor device. The method further includes forming a first airgap and a second airgap within the region by etching portions of dielectric material within the region through the first and second openings in the etch stop layer. The method further includes sealing the first and second airgaps by depositing a layer of low-k dielectric material on the etch stop layer.

In a particular aspect, a device includes first means for conducting charge and second means for conducting charge. The device includes means for reducing parasitic capacitance within a region between the first means for conducting charge and the second means for conducting charge. The device includes means for etch limiting that defines first and second openings proximate to the region.

In a particular aspect, a computer-readable medium or device stores data for enabling fabrication equipment to form an electronic device. The data, when used by the fabrication equipment, causes the fabrication equipment to form first and second openings in an etch stop layer proximate to a region of a dielectric layer between first and second conductive structures. The data, when used by the fabrication equipment, further causes the fabrication equipment to form first and second airgaps within the region by etching portions of dielectric material through the first and second openings in the etch stop layer. The data, when used by the fabrication equipment, further causes the fabrication equipment to seal the first and second airgaps by depositing a layer of low-k dielectric material on the etch stop layer.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

To reduce the capacitance between adjacent metal interconnects, a dielectric constant of a region between adjacent metal interconnects may be increased. An electronic device may include a plurality of discontinuous airgaps formed in one or more regions (e.g., of a dielectric layer) between one or more pairs of adjacent conductive structures (e.g., metal interconnects). The plurality of discontinuous airgaps may be formed by etching portions of dielectric material in the one or more regions through multiple openings defined by an etch stop layer located proximate to (e.g., on, over, or above) the one or more regions. The multiple openings defined by the etch stop layer may be formed using a photolithography process that enables a dimension (e.g., a width) of the multiple openings to be less than a distance (e.g., a smallest distance) between adjacent conductive structures. After the plurality of discontinuous airgaps are formed, a layer of material (e.g., a low-K dielectric) may be deposited proximate to (e.g., on, above, or over) the etch stop layer. The low-k dielectric material may form a sealing layer that covers the multiple openings defined by the etch stop layer.

Figure 1A:
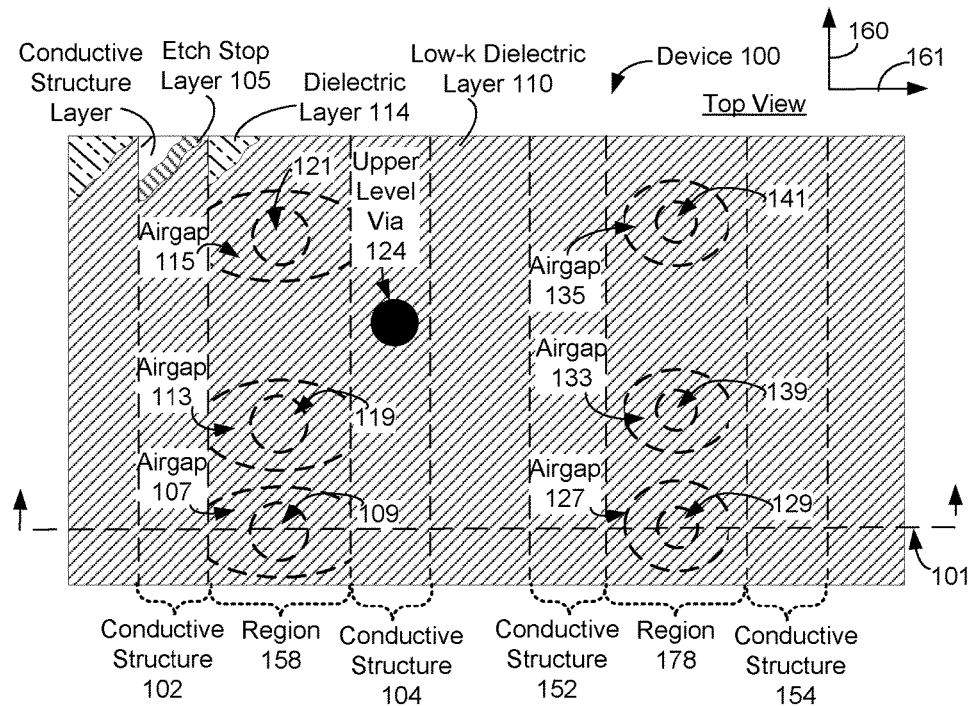
FIGS. 1A and 1B illustrate a top view and a cross-sectional view, respectively, of a device including an etch stop layer defining multiple openings and including discontinuous airgaps between conductive structures.
Figure 1B:
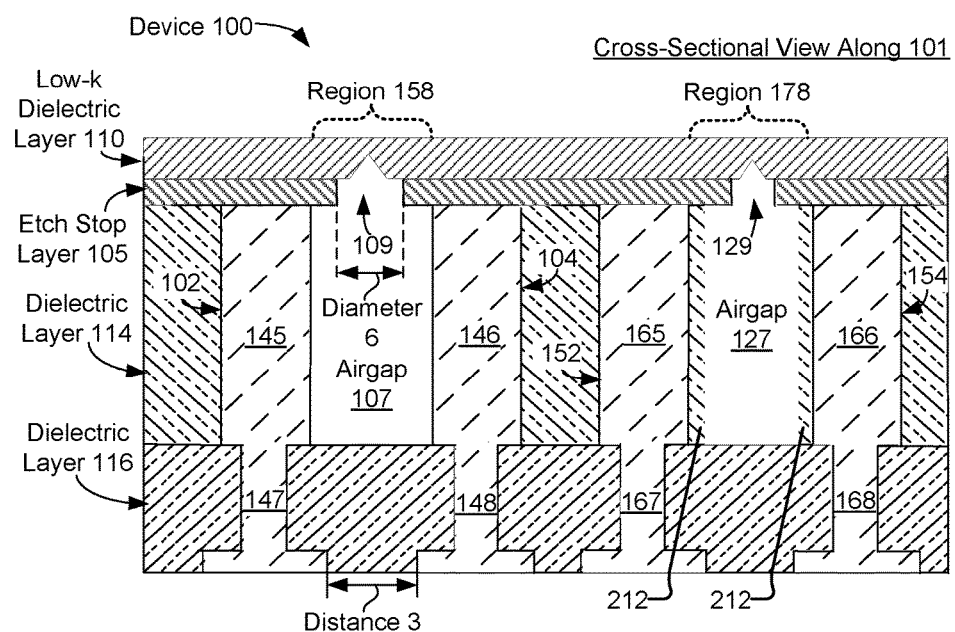

A top view of an electronic device 100 is shown in FIG. 1A. A cross-sectional view along line 101 of the electronic device 100 is shown in FIG. 1B. The electronic device 100 includes an etch stop layer 105. The electronic device 100 may include one or more dielectric layers 110, 114, 116. The dielectric layer 116 may include an ultra low-K dielectric material, such as, for example, porous hydrogenated silicon oxycarbide (pSiCOH). The dielectric layer 110 may include silicon oxycarbide (SiCO), silicon carbonitride (SiCN), aluminum nitride (AlN), or a combination thereof. The dielectric layer 114 may include silicon dioxide ($SiO_2$).

The electronic device 100 also includes a first conductive structure 102, a second conductive structure 104, a third conductive structure 152, and a fourth conductive structure 154. The first conductive structure 102 may be adjacent to the second conductive structure 104 in the sense that there is not an intervening conductive structure between the first conductive structure 102 and the second conductive structure 104. The third conductive structure 152 may be adjacent to the fourth conductive structure 154 in the sense that there is not an intervening conductive structure between the third conductive structure 152 and the second conductive structure 154. Although the electronic device 100 is illustrated as including four conductive structures, the electronic device 100 may include more than or less than four conductive structures. Additionally, although the electronic device 100 is illustrated as including two pairs of adjacent conductive structures, the electronic device 100 may include one pair of adjacent conductive structures or more than two pairs of adjacent conductive structures.

One or more of the conductive structures 102, 104, 152, and 154 may include a metal interconnect portion. For example, the first and second conductive structures 102 and 104 may include the metal interconnect portions 145 and 146, respectively, and the third and fourth conductive structures 152 and 154 may include the metal interconnect portions 165 and 166, respectively. One or more of the conductive structures 102, 104, 152, and 154 may include a contact/via portion. For example, the first and second conductive structures 102 and 104 may include the contact/via portions 147 and 148, respectively, and the third and fourth conductive structures 152 and 154 may include the contact/via portions 167 and 168, respectively. Each of the metal interconnect portions 145 and 146 may be coupled to a semiconductor structure (e.g., a "first semiconductor structure") [not illustrated], such as a transistor, or coupled to another electronic component or device using the contact/via portions 147 and 148, respectively. Each of the metal interconnect portions 165 and 166 may be coupled to a semiconductor structure (e.g., the first semiconductor structure or a different semiconductor structure [not illustrated]) using the contact/via portions 167 and 168, respectively. The conductive structures 102, 104, 152, and 154 may include copper (Cu), aluminum (Al), gold (Au), silver (Ag), or another metal.

The dielectric layers 114 and 116, and the conductive structures 102, 104, 152, and 154, may be formed using a dual damascene process. For example, the dielectric layers 114 and 116 may be deposited and patterned using lithography and etching techniques to form trenches for via and metal interconnects. One or more diffusion barrier layers may be deposited to line the trenches. Conductive material may then be deposited in the lined trenches to form the conductive structures 102, 104,152, and 154. Excess metal may be removed using a chemical mechanical polishing process (CMP). Though not illustrated, an electromigration cap layer may be deposited proximate to (e.g., on, above or over) the conductive structures 102, 104, 152, and 154.

The etch stop layer 105 may be formed proximate to (e.g., on, above, or over) the dielectric layer 114 and one or more of the conductive structures 102, 104, 152, 154. In some embodiments in which an electromigration cap layer is deposited on one or more of the conductive structures 102, 104, 152, and 154, the electromigration cap layer may be between the etch stop layer 105 and the conductive structures 102, 104, 152, and 154. The etch stop layer 105 may be a Barrier Low K ("BLOK") layer. The etch stop layer 105 may include silicon carbide, silicon carbide doped oxide (SiCO), silicon carbon nitride (SiCN), aluminum nitride (AlN), or a combination thereof. The etch stop layer 105 may be deposited using chemical vapor deposition (CVD).

The etch stop layer 105 defines openings proximate to (e.g., on, above, or over) one or more regions of the dielectric layer between first and second conductive structures and/or proximate to one or more regions of the dielectric layer between third and fourth conductive structures. For example, the etch stop layer 105 may define a first opening 109, a second opening 119, and a third opening 121 proximate to (e.g., on, above, or over) a region 158 of the dielectric layer 114 between the first and second conductive structures 102 and 104. The etch stop layer 105 may also define a fourth opening 129, a fifth opening 139, and a sixth opening 141 proximate to a region 178 of the dielectric layer 114 between the third and fourth conductive structures 152 and 154. The openings 109, 119, 121, 129, 139, and 141 may be formed by etching the etch stop layer 105. One or more of the openings 109, 119, 121, 129, 139, or 141 may have a geometry that is substantially circular. Although the electronic device 100 is illustrated as including an etch stop layer 105 that defines three openings proximate to each of the first and second regions 158 and 178, the etch stop layer 105 may define more than or less than three openings proximate to one or more of the first and second regions 158 and 178. Further, although the electronic device 100 is illustrated as including multiple openings in the etch stop layer 105 proximate to the first and second regions 158 and 178, the etch stop layer 105 may not define multiple openings proximate to both the first and second regions 158 or 178. For example, the etch stop layer 105 may define multiple openings (e.g., the openings 109, 119, or 121) proximate to the first region 158 without defining any openings proximate to the second region 178.

One or more of the openings 109, 119, or 121 may have a characteristic dimension (e.g., a width along direction 161 or a diameter 6) that is less than a distance (e.g., a smallest distance) between the first and second conductive structures 102 and 104. Likewise, one or more of the openings 129, 139, or 141 may have a characteristic dimension that is less than a distance between the third and fourth conductive structures 152 and 154. For example, when one or more of the openings (e.g., when a cross-section of one or more of the openings) 109, 119, or 121 are substantially circular, the characteristic dimension may correspond to the diameter 6 of the substantially circular or circularly cylindrical openings 109, 119, or 121. In this example, the diameter 6 of the one or more substantially circular or circularly cylindrical openings 109, 119, or 121 is less than the distance 3. In a particular embodiment, the characteristic dimension may be less than a minimum distance allowed (e.g., according to manufacturing variations or tolerances) between adjacent metal interconnects by a semiconductor fabrication process. Although the openings 109, 119, 121, 129, 139, and 141 are illustrated as having a substantially circular or circularly cylindrical geometry, one or more of the openings 109, 119, 121, 129, 139, and 141 may have other geometries (e.g., substantially square or rectangular geometry). Further, one or more of the openings 109, 119, 121, 129, 139, or 141 may have a different geometry (e.g., dimensions and/or shape) than one or more of the other openings of the openings 109, 119, 121, 129, 139, or 141. For example, the first opening (e.g., a cross-section of the first opening) 109 may be substantially circular while the second opening (e.g., a cross-section of the opening) 119 may have a different geometry (e.g., a substantially square cross-sectional geometry or a substantially rectangular cross-sectional geometry).

A dimension (e.g., a width along the direction 161, a diameter 6, or a length along the direction 160) of one or more of the openings 109, 119, 121, 129, 139, or 141 may be selected based on whether the conductive structures have a wiring delay time corresponding to an operating speed of an electronic device including the electronic device 100 (e.g., whether the two adjacent conductive structures 102 and 104 are in a "critical path" of the electronic device).

In some examples, openings defined proximate to a region between conductive structures that are in a critical path of the electronic device 100 may be selected to be larger than openings defined proximate to a region between conductive structures that are not in a critical path of the electronic device 100. For example, the first and second conductive structures 102 and 104 may have a wiring delay time corresponding to an operating speed of the electronic device 100, while the third and fourth conductive structures 152 and 154 may not have a wiring delay time corresponding to an operating speed of the electronic device 100. In this example, a dimension (e.g., a cross-sectional distance along the direction 161, the diameter 6, or the cross-sectional distance along the direction 160) of one or more of the openings 109, 119, or 121 may be selected to be larger than a dimension (e.g., the width, diameter, or length) of one or more of the openings 129, 139, or 141. The larger dimension of the openings 109, 119, or 121 formed between conductive structures that are in the critical path may enable formation of larger (e.g., wider, longer, and/or deeper) airgaps in the dielectric layer 114 of the region 158.

The electronic device 100 includes airgaps formed in one or more regions between first and second conductive structures and/or airgaps formed in one or more regions between third and fourth conductive structures. For example, a first airgap 107, a second airgap 113, and a third airgap 115 may be formed in the region 158 of the dielectric layer 114 between the first and second conductive structures 102 and 104, and a fourth airgap 127, a fifth airgap 133, and a sixth airgap 135 may be formed in the region 178 of the dielectric layer 114 between the third and fourth conductive structures 152 and 154. The airgaps 107, 113, and 115 may be formed by etching portions of dielectric material (e.g., of the dielectric layer 114) through the openings 109, 119, and 121, respectively. The airgaps 127, 133, and 135 may be formed by etching portions of dielectric material (e.g., of the dielectric layer 114) through the openings 129, 139, and 141, respectively. The dielectric material of the portions of the dielectric layer 114 may be etched isotropically (e.g., using wet chemical etching) or anisotropically.

Although the electronic device 100 is illustrated as including three airgaps between the first and second conductive structures 102 and 104 and three airgaps between the third and fourth conductive structures 152 and 154, the electronic device 100 may include more than or less than three airgaps between the first and second conductive structures 102 and 104 or between the third and fourth conductive structures 152 and 154. Further, the electronic device 100 may not include airgaps between both the first and second conductive structures 102 and 104 and between the third and fourth conductive structures 152 and 154. For example, the electronic device 100 may include the airgaps 107, 113, and 115, but not the airgaps 127, 133, and 135, or vice versa. Further, although the airgaps 107, 113, 115, 127, 133, and 135 are illustrated as having an oval cross section, airgaps having other cross-sectional geometries may be formed. Additionally, although the airgaps 107, 113, and 115 are illustrated as including at least a portion that spans across the region 158 between the first and second conductive structures 102 and 104, one or more of the airgaps 107, 113, and 115 may not span across the region 158. For example, the first airgap 107 may have a width (e.g., of a widest portion) that is less than a distance along the direction 161 across the region 158, in which case at least a portion of the dielectric layer 114 would remain between the first airgap 107 and one or more of the first and second conductive structures 102 and 104 after etching of the dielectric layer 114 through the first opening 109. Furthermore, one or more of the airgaps 107, 113, 115, 127, 133, or 135 may not extend the full depth of the dielectric layer 114 or may extend deeper than the dielectric layer 114 (e.g., into the dielectric layer 116).

The low-K dielectric layer 110 is formed proximate to (e.g., on, over, or above) the etch stop layer 105. The low-K dielectric layer 110 may be formed by any deposition technique, such as, for example, a chemical or physical deposition technique. The low-K dielectric layer 110 may form a sealing layer that covers the openings 109, 119, 121, 129, 139, and 141 and that seals the airgaps 107, 113, 115, 127, 133, and 135. The low-K dielectric layer 110 may be a Barrier Low K ("BLOK") layer. The low-K dielectric layer 110 may include silicon carbide (SiC), silicon carbide doped oxide (SiCO), silicon carbon nitride (SiCN), aluminum nitride (AlN), or a combination thereof.

The electronic device 100 may include an upper level via 124. The upper level via 124 may be coupled to the first conductive structure 104. An upper metallization layer [not illustrated] may be formed proximate to (e.g., on, above, or over) the low-k dielectric layer 110. The upper metallization layer may be coupled to the first conductive structure 104 through the low-k dielectric layer 110 and the etch stop layer 105 by the upper level via 124. In a particular example, one or more of the openings 109, 119, and 121 may be spaced to provide an area for formation of the upper level via 124. For example, a spacing (e.g., as measured between opening centers or opening edges) between the second opening 119 and the third opening 121 may be greater than a spacing between the first opening 109 and the second opening 119. The larger spacing between the second opening 119 and the opening 121 may prevent (or reduce the likelihood of) formation of a misaligned upper level via 124 in an airgap.

Figure 2:
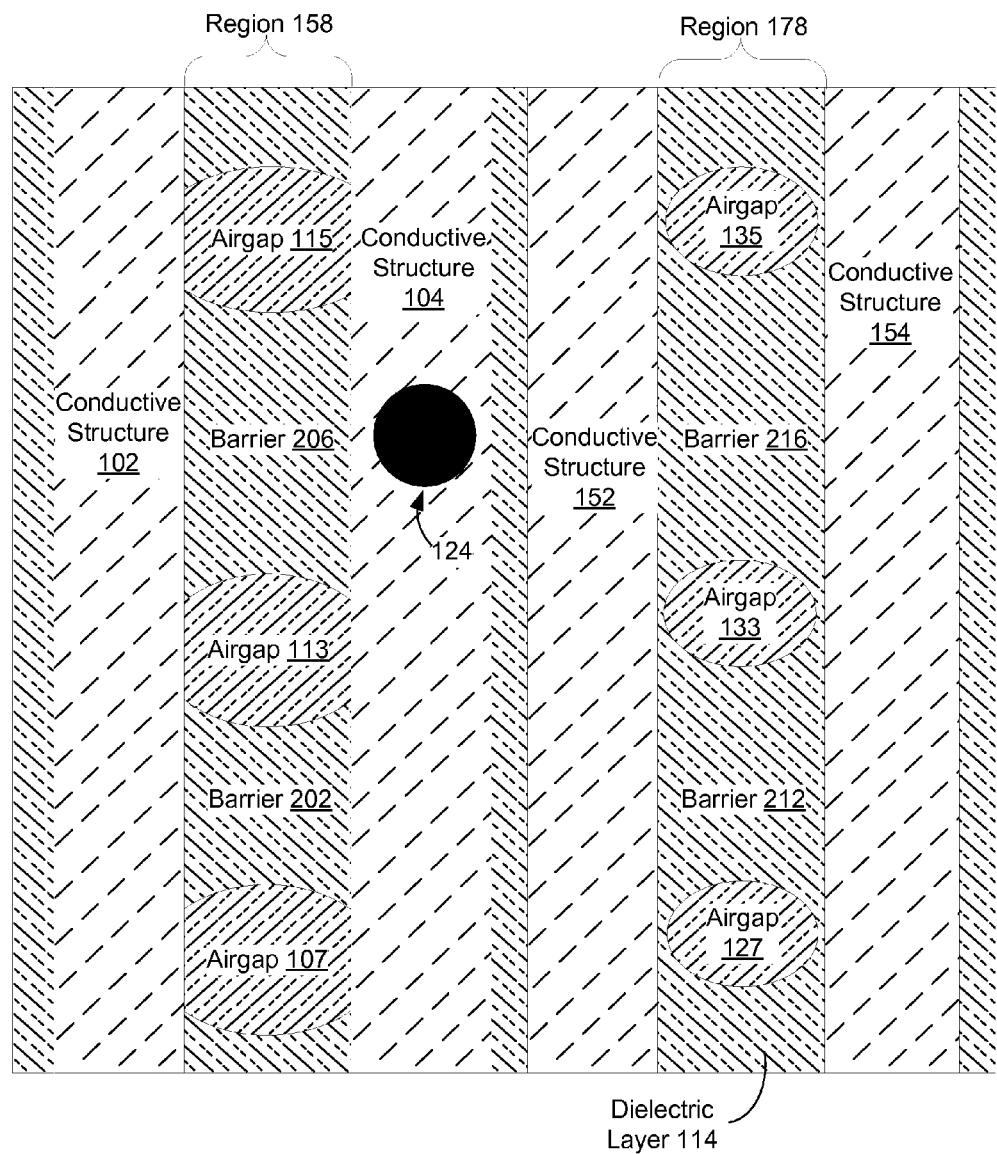
FIG. 2 illustrates a top view of the device of FIGS. 1A and 1B below an etch stop layer.

A top view of the electronic device 100 of FIGS. 1A and 1B below the etch stop layer 105 is shown in FIG. 2. Each of the airgaps 107, 113, and 115 may be separated from an adjacent airgap by one or more portions of dielectric material of the dielectric layer 114 that remain after formation of the airgaps 107, 113, and 115 (e.g., material of the dielectric layer 114 that was not etched during etching of the dielectric layer 114 to form the airgaps 107, 113, and 115). For example, the first airgap 107 may be separated from the second airgap 113 by a barrier 202, and the second airgap 113 may be separated from the third airgap 115 by a barrier 206. Each of the airgaps 127, 133, and 135 may be separated from an adjacent airgap by one or more portions of dielectric material of the dielectric layer 114 that remain after formation of the airgaps 127, 133, and 135 (e.g., material of the dielectric layer 114 that was not etched during etching of the dielectric layer 114 to form the airgaps 127, 133, and 135). For example, the fourth airgap 127 may be separated from the fifth airgap 133 by a barrier 212, and the fifth airgap 133 may be separated from the sixth airgap 135 by a barrier 216. The barrier 206 may be adjacent to a portion of the first conductive structure 104 that is coupled to the upper level via 124.

A spacing (e.g., as measured between airgap centers or airgap edges) between a first adjacent pair of the airgaps 107, 113, and 115 may be greater than a spacing between a second adjacent pair of the airgaps 107, 113, and 115. For example, the spacing between the second airgap 113 and the third airgap 115 may be greater than the spacing between the first airgap 107 and the second airgap 113. Due to the greater spacing between the second and third airgaps 113 and 115 than the spacing between the first and second airgaps 107 and 113, the barrier 206 may include more dielectric material than the barrier 202. Thus, the barrier 206 may possess more mechanical strength than the barrier 202. The barrier 206 may thus be able to withstand a greater structural load from overlying layers and/or overhead structures (e.g., the upper level via 124) than the barrier 202.

Figure 3:
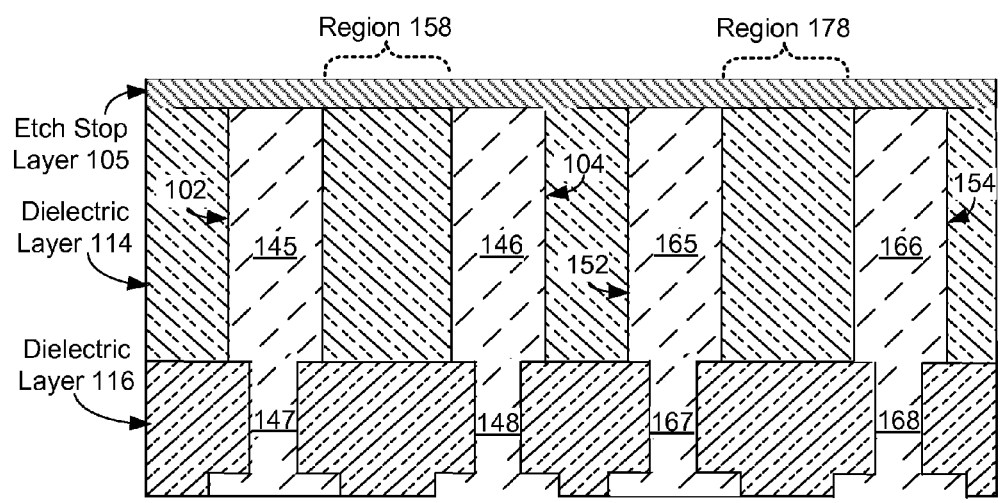
FIG. 3 illustrates a first particular stage of a process of fabricating the device of FIGS. 1A and 1B.

FIGS. 3-5, 6B, 7A, 7B, 8, 9A, and 9B illustrate stages of fabricating one or more devices including airgaps in one or more regions between conductive structures. For example, the illustrative stages of FIGS. 3-5, 6A, 6B, 7A, 7B, 8, 9A, and 9B may be used to fabricate the electronic device 100 of FIGS. 1A and 1B. FIG. 3 illustrates a first particular stage during fabrication of the electronic device 100. The first particular stage of FIG. 3 includes forming (e.g., depositing) an etch stop layer 105 proximate to (e.g., on, above, or over) the dielectric layer 114 and the conductive structures 102, 104, 152, 154.

The dielectric layers 114 and 116, and the conductive structures 102, 104, 152, and 154, may be formed using a dual damascene process as described above. Although not illustrated, an electromigration cap layer may be deposited on one or more of the conductive structures 102, 104, 152, and 154. For example, the electromigration cap layer may include cobalt tungsten phosphide (CoWP). In some embodiments in which an electromigration cap layer is deposited on one or more of the conductive structures 102, 104, 152, and 154, the electromigration cap layer may be between the etch stop layer 105 and the one or more conductive structures 102, 104, 152, and 154. The etch stop layer 105 may include SiCO, SiCN, AlN, or a combination thereof. The etch stop layer 105 may be deposited using CVP.

Figure 4:
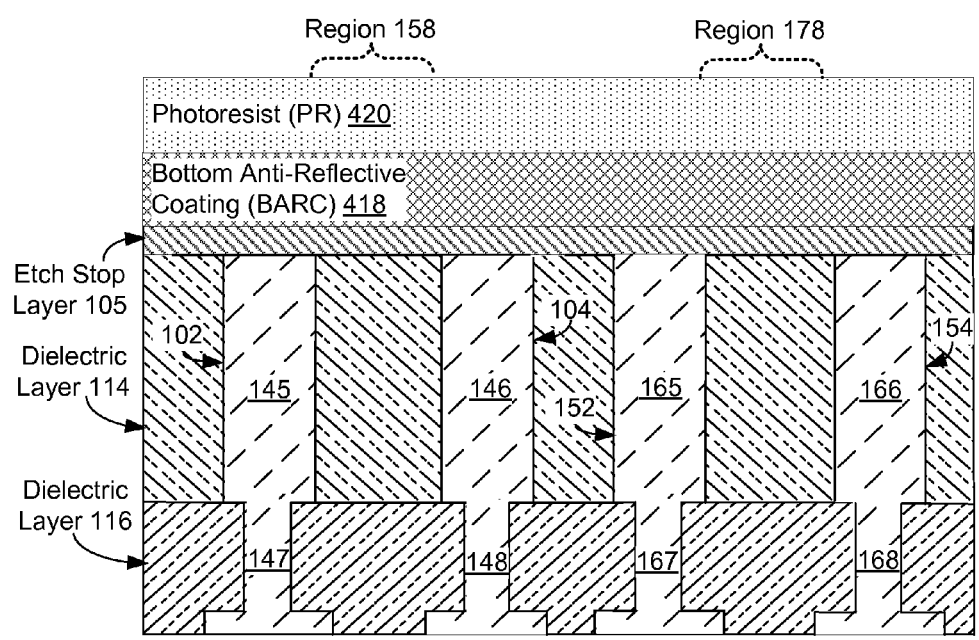
FIG. 4 illustrates a second particular stage of the process of fabricating the device of FIGS. 1A and 1B.

FIG. 4 illustrates a second particular stage during formation of the electronic device 100. The second particular stage may be after the first particular stage of FIG. 3. During the second particular stage of formation of the electronic device 100, a bottom anti-reflective coating (BARC) 418 may be formed (e.g., deposited) proximate to (e.g., on, above, or over) the etch stop layer 105, and a photoresist (PR) (e.g., a layer of PR) 420 may be formed (e.g., deposited) proximate to (e.g., on, above, or near) the BARC 418. In some embodiments, an optional organic planarization layer [not illustrated] is deposited between the BARC 418 and the etch stop layer 105.

Figure 5:
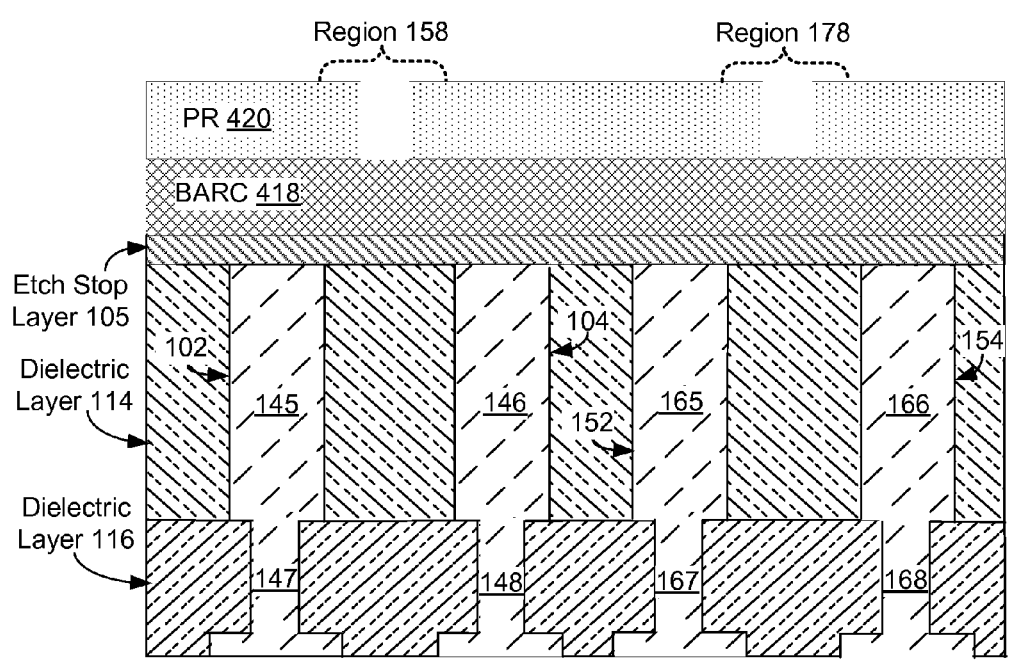
FIG. 5 illustrates a third particular stage of the process of fabricating the device of FIGS. 1A and 1B.

A top view during a third particular stage during formation of the electronic device 100 is shown in FIG. 5. The third particular stage may be after the second particular stage of FIG. 4. During the third particular stage of formation of the electronic device 100, the PR 420 is patterned to form a patterned PR 420.

Figure 6A:
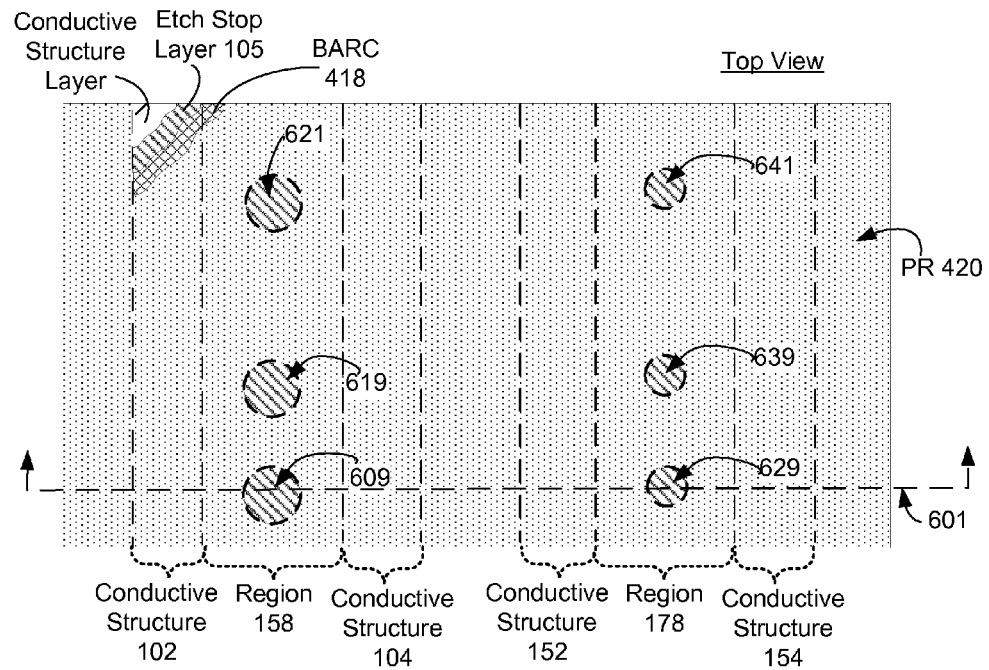
FIGS. 6A and 6B illustrate a top view and a cross-sectional view, respectively, of a fourth particular stage of the process of fabricating the device of FIGS. 1A and 1B.
Figure 6B:
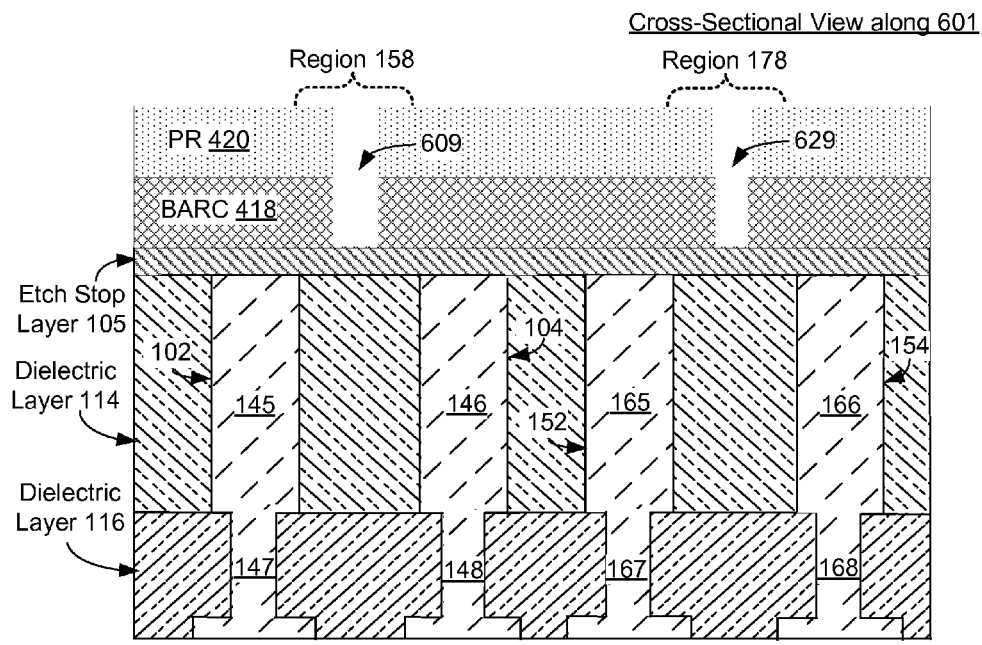

A top view during a fourth particular stage during formation of the electronic device 100 is shown in FIG. 6A. A cross-sectional view along line 601 is shown in FIG. 6B. The fourth particular stage may be after the third particular stage of FIG. 5. During the fourth particular stage of formation of the electronic device 100, the BARC 418 is etched to form openings (e.g., "BARC openings") 609, 619, and 621 proximate to the first region 158 between the first and second conductive structures 102 and 104. The BARC 418 may also be etched to form BARC openings 629, 639, and 641 in the region 178 between the third and fourth conductive structures 152 and 154. The BARC openings 609, 619, 621, 629, 639, and 641 may be etched in the BARC 418 during a single etching step. The number of BARC openings patterned/formed in the PR 420 and BARC 418 proximate to the first region 158 may correspond to a number of openings to be formed in the etch stop layer 105 proximate to the first region 158. Additionally, or alternatively, the number of BARC openings patterned/formed in the PR 420 and BARC 418 proximate to the second region 178 may correspond to a number of openings to be formed in the etch stop layer 105 proximate to the second region 178. For example, when more than three openings are to be formed in the etch stop layer 105 proximate to the first region 158, more than three BARC openings may be formed in the BARC 418 proximate to the first region 158.

Figure 7A:
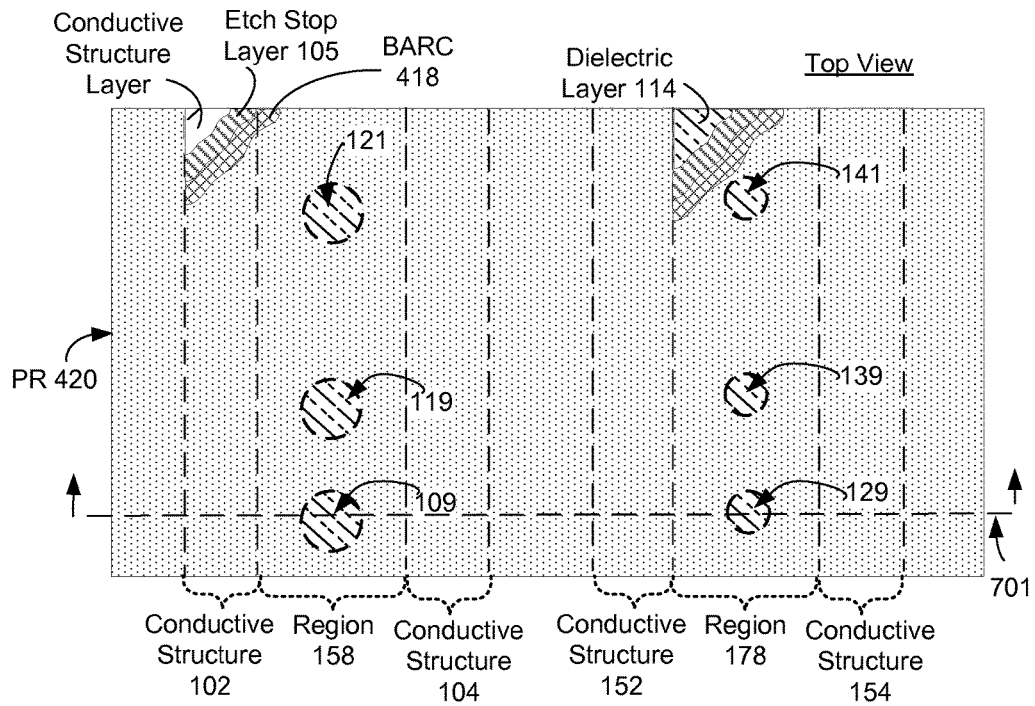
FIGS. 7A and 7B illustrate a top view and a cross-sectional view, respectively, of a fifth particular stage of the process of fabricating the device of FIGS. 1A and 1B.
Figure 7B:
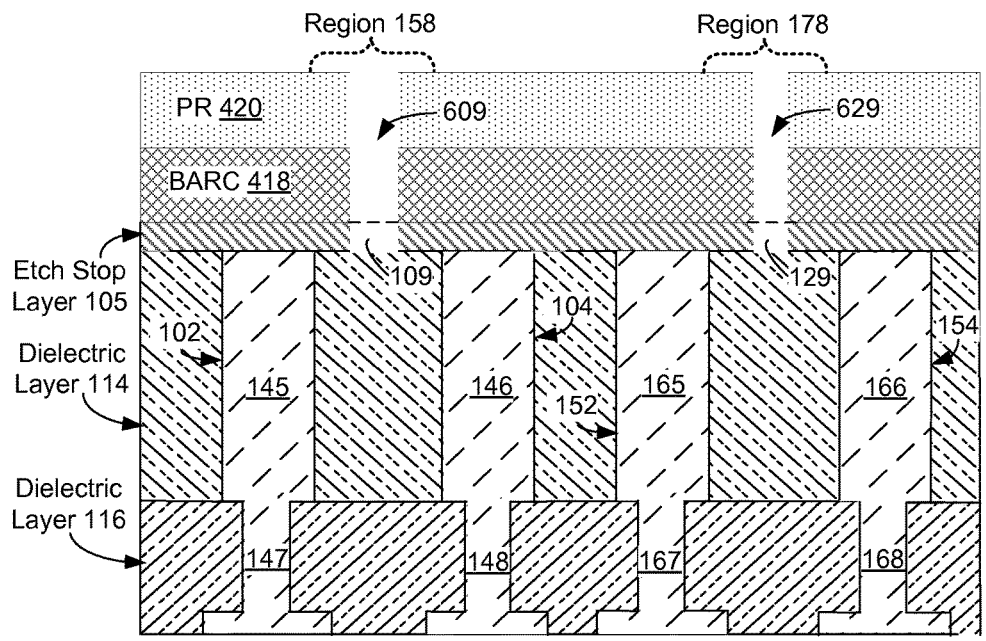

A top view during a fifth particular stage during formation of the electronic device 100 is shown in FIG. 7A. A cross-sectional view along line 701 is shown in the lower illustration of FIG. 7B. The fifth particular stage may be after the fourth particular stage of FIGS. 6A and 6B. During the fifth particular stage of formation of the electronic device 100, the etch stop layer 105 is etched to create the openings 109, 119, 121, 129, 139, and 141.

For example, during the fifth particular stage, the openings 109, 119, 121, 129, 139, and 141 may be formed in the etch stop layer 105 by etching the etch stop layer 105 through the BARC openings 609, 619, 621, 629, 639, and 641 (of FIGS. 6A and 6B), respectively, in the PR 420 and the BARC 418.

Figure 8:
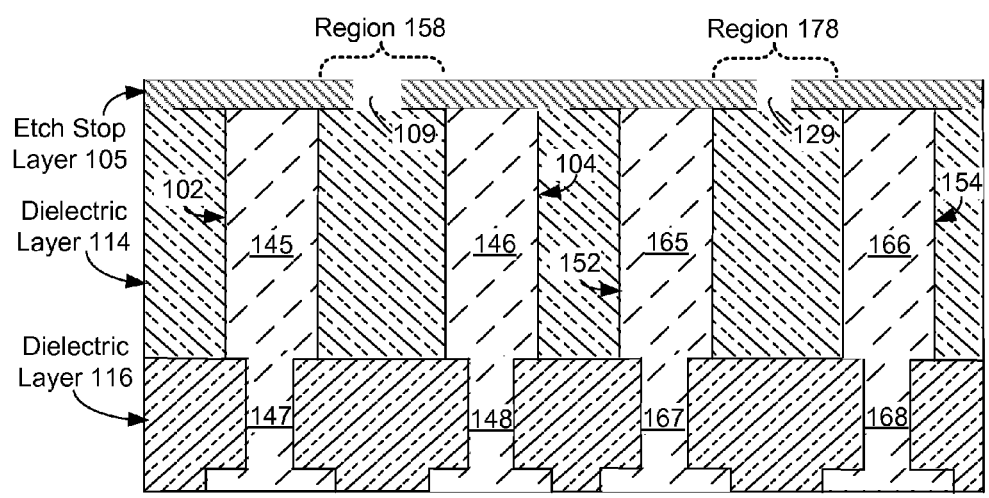
FIG. 8 illustrates a sixth particular stage of the process of fabricating the device of FIGS. 1A and 1B.

FIG. 8 illustrates a sixth particular stage during formation of the electronic device 100. The sixth particular stage may be after the fifth particular stage of FIGS. 7A and 7B. During the sixth particular stage of formation of the electronic device 100, the PR 420 and BARC 418 of FIGS. 7A and 7B may be removed. The PR 420 and the BARC 418 may be removed using an ashing process.

Figure 9A:
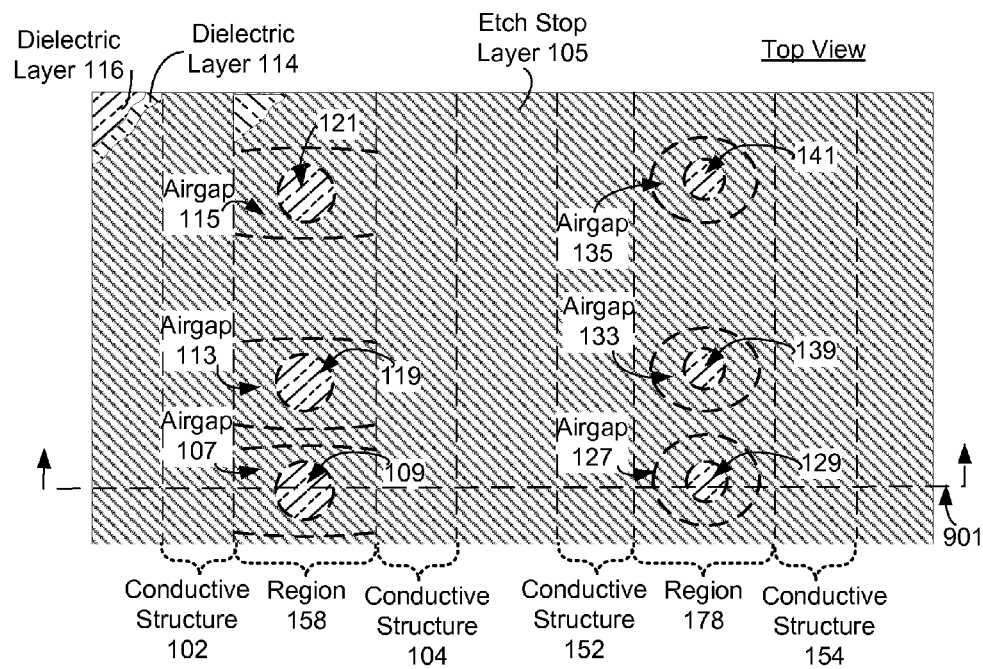
FIGS. 9A and 9B illustrate a top view and a cross-sectional view, respectively, of a seventh particular stage of the process of fabricating the device of FIGS. 1A and 1B.
Figure 9B:
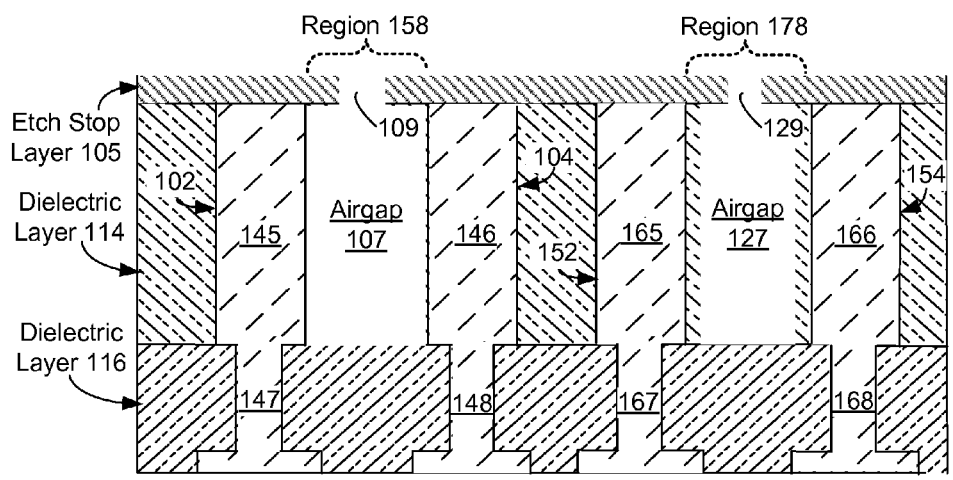

A top view during a seventh particular stage during formation of the electronic device 100 is shown in FIG. 9A. A cross-sectional view along line 901 is shown in FIG. 9B. The seventh particular stage may be after the sixth particular stage of FIG. 8. During the seventh particular stage of formation of the electronic device 100, the airgaps 107, 113, 115, 127, 133, and 135 may be formed by etching portions of dielectric material (e.g., of the dielectric layer 114) through corresponding openings in the etch stop layer 105. For example, the airgaps 107, 113, and 115 may be formed by etching portions of dielectric material of the dielectric layer 114 proximate to the first region 158 through the openings 109, 119, and 121 defined by the etch stop layer 105. As another example, the airgaps 127, 133, and 135 may be formed by etching portions of dielectric material of the dielectric layer 114 proximate to the second region 178 through the openings 129, 139, and 141 defined by the etch stop layer 105. The portions of dielectric material of the dielectric layer 114 may be etched isotropically (e.g., using wet chemical etching) or anisotropically.

Referring back to FIGS. 1A and 1B, an eighth particular stage during formation of the electronic device 100 is illustrated. The eighth particular stage may be after the seventh particular stage of FIGS. 9A and 9B. During the eighth particular stage of formation of the electronic device, the low-k dielectric layer 110 is formed (e.g., deposited) proximate to (e.g., on, above, or near) the etch stop layer 105. The low-k dielectric layer 110 may be formed using a deposition technique, such as, for example, a chemical or physical deposition technique. The low-k dielectric layer 110 may form a sealing layer that covers the openings 109, 119, 121, 129, 139, and 141. The low-k dielectric layer 110 may seal the airgaps 107, 113, 115, 127, 133, and 135.

Figure 10:
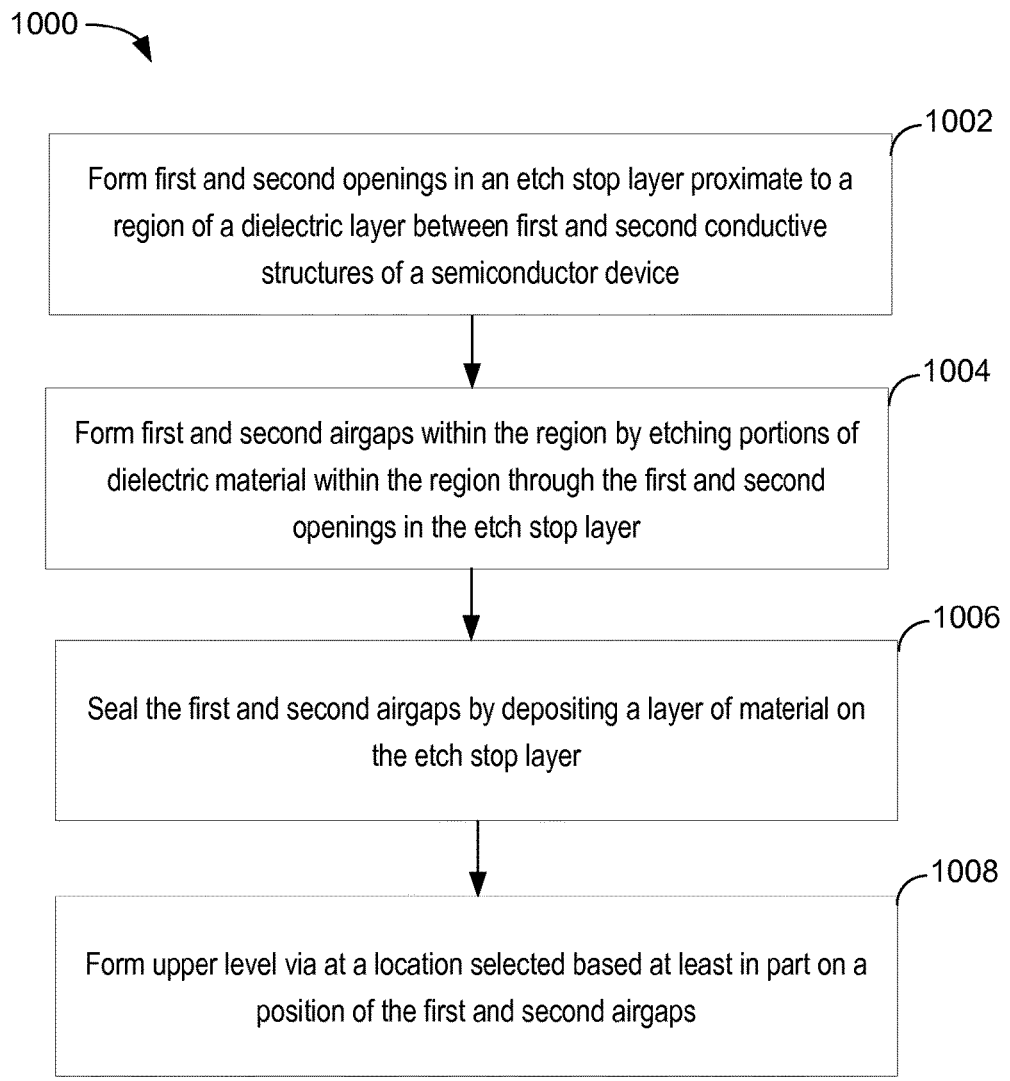
FIG. 10 is a flowchart of a process of forming the device of FIGS. 1A and 1B.

Referring to FIG. 10, a flow chart of an illustrative embodiment of a method 1000 of fabricating an electronic device is depicted. The electronic device may correspond to the electronic device 100 of FIGS. 1A and 1B. The method 1000 may include the first through eighth stages described with reference to FIGS. 1A, 1B, 3, 4, 5, 6A, 6B, 7A, 7B, 8, 9A, and 9B.

The method 1000 includes forming, at 1002, first and second openings in an etch stop layer proximate to one or more regions of a dielectric layer in one or more regions between first and second conductive structures of an electronic device. The first and second openings may correspond to the first opening 109 and the second opening 119 of FIGS. 1A and 1B. The first and second conductive structures may correspond to the first and second conductive structures 102 and 104 of FIGS. 1A and 1B. The etch stop layer may correspond to the etch stop layer 105 of FIGS. 1A and 1B. The dielectric layer may correspond to the dielectric layer 114 of FIGS. 1A and 1B. The first and second openings 109 and 119 may be formed as described above with reference to the second, third, fourth, and fifth stages as described above with reference to FIGS. 4, 5, 6A, 6B, 7A, 7B, and or 8.

In some examples, forming, at 1002, the first and second openings 109 and 119 of FIGS. 1A and 1B in the etch stop layer 105 may not include etching portions of the etch stop layer 105 between the low-k dielectric layer 110 and the first and second conductive structures 102 and 104. For example, the portion of the etch stop layer 105 above one or more of the first and second conductive structures 102 and 104 may not be etched during formation of the first and second openings 109 and 119. Avoiding etching over the conductive structures may prevent etching the electromigration cap layer (where present as describe above).

The method 1000 may include forming, at 1004, first and second airgaps within a region between first and second conductive structures. For example, the method 1000 may include forming the first airgap 107 and the second airgap 113 of FIGS. 1A and 1B within the first region 158 by etching portions of dielectric material within the first region 158 through the first and second openings 109 and 119 in the etch stop layer 105 as described with reference to FIGS. 1A, 1B, and 2 and the sixth stage of the illustrative fabrication process described with reference to FIGS. 8A and 8B.

The method 1000 may include sealing, at 1006, the first and second airgaps 107 and 113. For example, the method 1000 may include sealing the first and second airgaps 107 and 113 by depositing a layer of low-k dielectric material 110 on the etch stop layer 105 as described with reference to FIGS. 1A and 1B and the eighth stage of the illustrative fabrication process.

The method 1000 may include forming, at 1008, an upper level via. For example, the upper level via 124 of FIG. 1A may be formed as described with reference to the electronic device 100. With reference to FIGS. 1A, 1B, and 2, the upper level via 124 may be formed proximate to a barrier 206 between the second airgap 113 and the third airgap 115. The upper level via 124 may be formed away from the openings 109, 119, and 121 to prevent (or reduce a likelihood of) formation of the upper level via 124 within one or more of the openings 109, 119, or 121 (e.g., in one or more of the airgaps 107, 113, or 115).

In some embodiments, the first and second conductive structures 102 and 104 of FIGS. 1A and 1B may have a wiring delay time that corresponds to an operating speed of an electronic device 100, while the third and fourth conductive structures 152 and 154 of FIGS. 1A and 1B do not have a wiring delay time that corresponds to an operating speed of the electronic device 100. In some of these embodiments, a dimension (e.g., a width, diameter, or length) of the openings 109, 119, and 121 of FIGS. 1A and 1B in the etch stop layer 105 proximate to the first and second conductive structures 102 and 104 of FIGS. 1A and 1B is greater than the dimension of the openings 129, 139, and 141. The greater dimension may allow for deeper airgaps to be etched in the dielectric layer 114 of the first region 158 between the first and second conductive structures 102 and 104 of FIGS. 1A and 1B.

Figure 11:
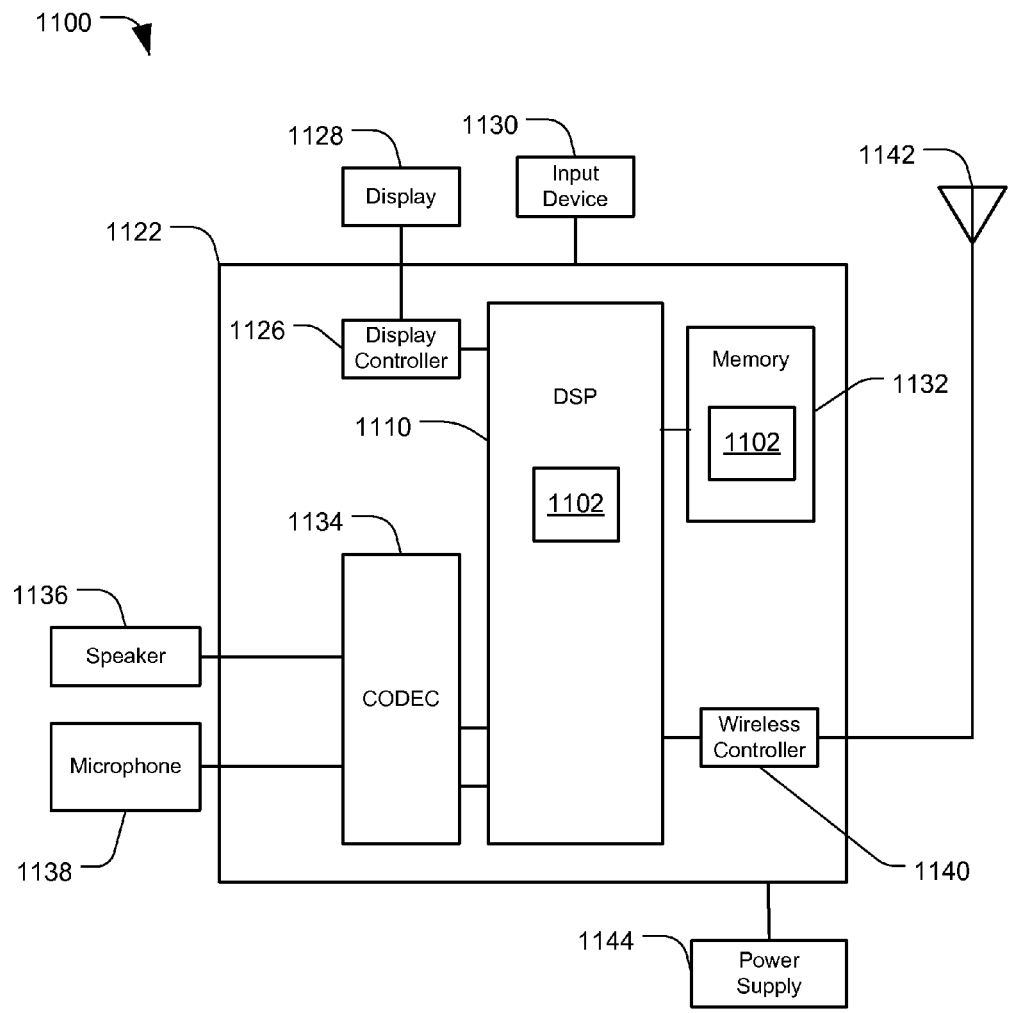
FIG. 11 is a block diagram of a wireless device including the device of FIGS. 1A and 1B.

Referring to FIG. 11, a block diagram of a particular illustrative embodiment of an electronic device (e.g., a wireless device) is depicted and generally designated 1100.

The electronic device 1100 includes a processor, such as a digital signal processor (DSP) 1110, coupled to a memory 1132. The DSP 1110, the memory 1132, or both, may include a semiconductor device 1102. The semiconductor device 1102 may be a semiconductor-based integrated circuit, such as a microprocessor. The semiconductor device 1102 may include one or more electronic devices that include multiple openings (e.g., the openings 109, 119, 121, 129, 139, or 141) and multiple discontinuous airgaps (e.g., the airgaps 107, 113, 115, 127, 133 or 135). For example, the semiconductor device 1102 may include the electronic device 100 of FIGS. 1A and 1B. The electronic device 100 may be coupled to a semiconductor structure (e.g., a transistor or other electronic component) to form the semiconductor device 1102 (e.g., the semiconductor-based integrated circuit). Additionally or alternatively, one or more other components of the device 1100 may include a semiconductor device including the electronic device 100 of FIGS. 1A and 1B.

FIG. 11 also shows a display controller 1126 that is coupled to the digital signal processor 1110 and to a display 1128. A coder/decoder (CODEC) 1134 can also be coupled to the digital signal processor 1110. A speaker 1136 and a microphone 1138 can be coupled to the CODEC 1134.

FIG. 11 also indicates that a wireless controller 1140 can be coupled to the digital signal processor 1110 and to an antenna 1142. In a particular embodiment, the DSP 1110, the display controller 1126, the memory 1132, the CODEC 1134, and the wireless controller 1140 are included in a system-in-package or system-on-chip device 1122. In a particular embodiment, an input device 1130 and a power supply 1144 are coupled to the system-on-chip device 1122. Moreover, in a particular embodiment, as illustrated in FIG. 11, the display 1128, the input device 1130, the speaker 1136, the microphone 1138, the antenna 1142, and the power supply 1144 are external to the system-on-chip device 1122. However, each of the display 1128, the input device 1130, the speaker 1136, the microphone 1138, the antenna 1142, and the power supply 1144 can be coupled to a component of the system-on-chip device 1122, such as an interface or a controller.

Additionally, the foregoing disclosed devices and functionalities, e.g., as described in reference to any one or more of FIGS. 1-11, may be designed and configured into computer files (e.g., RTL, GDSII, GERBER, etc.) stored on computer readable media. Some or all of such files may be provided to fabrication handlers who fabricate devices based on such files. Resulting products include semiconductor wafers that are then cut into semiconductor die and packaged into a semiconductor chip. The semiconductor chips may be employed in the devices described above.

In conjunction with the described embodiments, a system is disclosed that may include first and second means for conducting charge formed on a substrate. The first means for conducting charge may be adjacent to the second means for conducting charge. For example, the first and second means for conducting charge may correspond to the first and second conductive structures 102 and 104 of FIGS. 1A and 1B, the third and fourth conductive structures 152 and 154 of FIGS. 1A and 1B, one or more other devices or circuits configured to conduct charge, or any combination thereof.

The system may also include means for reducing parasitic capacitance between the first means for conducting charge and the second means for conducting charge. The means for reducing parasitic capacitance may correspond to the airgaps 107, 113, 115, 127, 133, or 135 of FIGS. 1A and 1B. The means for reducing parasitic capacitance may be disposed in a means for separating the first and second means for conducting charge. The means for separating the first and second means for conducting charge may correspond to the dielectric layer 114 of FIGS. 1A and 1B.

The system may also include means for etch limiting. The means for etch limiting may correspond to the etch stop layer 105 of FIGS. 1A and 1B. The means for etch limiting defines openings proximate to the region. The openings defined by the means for etch limiting may correspond to the openings 109, 119, 121, 129, 139, or 141 of FIGS. 1A and 1B.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then integrated into electronic devices.

Although one or more of FIGS. 1A, 1B, 2-5, 6A, 6B, 7A, 7B, 8, 9A, 9B, 10 and 11 may illustrate systems, devices, and/or methods according to the teachings of the disclosure, the disclosure is not limited to these illustrated systems, devices, and/or methods. Embodiments of the disclosure may be suitably employed in any device that includes integrated circuitry including memory, a processor, and on-chip circuitry.

One or more functions or components of any of FIGS. 1A, 1B, 2-5, 6A, 6B, 7A, 7B, 8, 9A, 9B, 10 and 11 as illustrated or described herein may be combined with one or more other portions of another of FIGS. 1A, 1B, 2-5, 6A, 6B, 7A, 7B, 8, 9A, 9B, 10 and 11. Accordingly, no single embodiment described herein should be construed as limiting and embodiments of the disclosure may be suitably combined without departing form the teachings of the disclosure.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus, comprising:
   a dielectric layer;
   a first conductive structure;
   a second conductive structure;
   an etch stop layer on the dielectric layer, the etch stop layer defining a first opening, a second opening, and a third opening, wherein the first, second, and third openings are proximate to a region of the dielectric layer between the first and second conductive structures, wherein a spacing between the first opening and the second opening is greater than a spacing between the first opening and the third opening;
   a first airgap within the region;
   a second airgap within the region, wherein a first barrier of the dielectric layer is between the first airgap and the second airgap;
   a third airgap within the region, the first airgap, the second airgap, and the third airgap disposed consecutively within the region, wherein a second barrier of the dielectric layer is between the first airgap and the third airgap, and wherein the first barrier is larger than the second barrier;
   a layer of material proximate to the etch stop layer, the layer of material covering the first airgap, the second airgap, and the third airgap; and a via to the first conductive structure, wherein the via extends through the etch stop layer and is adjacent to the first barrier.

2. The apparatus of claim 1, wherein a cross-section of the first and second openings is substantially circular.

3. The apparatus of claim 1, the first and second openings having a dimension that is less than a distance between the first and second conductive structures.

4. The apparatus of claim 1, wherein the first barrier separates the first airgap from the second airgap.

5. The apparatus of claim 4, wherein the first opening is adjacent to the second opening and the third opening is adjacent to the first opening, wherein the third opening is located proximate to the third airgap, and wherein the second barrier separates the first airgap from the third airgap.

6. A device comprising:
   first means for conducting charge;
   second means for conducting charge;
   means for separating the first and second means for conducting charge;
   means for etch limiting, wherein the means for etch limiting defines first, second, and third openings, wherein a spacing between the first opening and the second opening is greater than a spacing between the first opening and the third opening;
   means for reducing parasitic capacitance within a region between the first means for conducting charge and the second means for conducting charge, the means for reducing parasitic capacitance including a first airgap, a second airgap, and a third airgap, the first airgap, the second airgap, and the third airgap disposed consecutively within the region, wherein a first barrier of the means for separating is between the first airgap and the second airgap, wherein a second barrier of the means for separating is between the first airgap and the third airgap, and wherein the first barrier is larger than the second barrier; and
   means for electrically connecting to the first means for conducting charge, wherein the means for electrically connecting extends through the means for etch limiting and is adjacent to the first barrier.

7. The device of claim 6, wherein a cross-section of the first and second openings is substantially circular.

8. The device of claim 6, the first and second openings having a dimension that is less than a distance between the first means for conducting charge and the second means for conducting charge.

9. A non-transitory computer readable storage device storing data for enabling fabrication equipment to form an electronic device, the data, when used by the fabrication equipment, causing the fabrication equipment to:
   form a first opening, a second opening, and a third opening in an etch stop layer proximate to a region of a dielectric layer between first and second conductive structures, wherein a spacing between the first opening and the second opening is greater than a spacing between the first opening and the third opening;
   etch first portions of dielectric material within the region through the first opening and the second opening in the etch stop layer to define a first airgap, a second airgap, and a first barrier of the dielectric material between the first airgap and the second airgap;
   etch second portions of the dielectric material within the region through the third opening to define a third airgap, the third airgap, the second airgap, and the first airgap disposed consecutively within the region, and a second barrier of the dielectric material between the first airgap and the third airgap, wherein the first barrier is larger than the second barrier;
   seal the first and second airgaps by depositing a layer of low-k dielectric material on the etch stop layer; and
   form, adjacent to the first barrier, a via extending through the etch stop layer to the first conductive structure.

10. The non-transitory computer readable storage device of claim 9, wherein causing the fabrication equipment to form the first and second openings comprises causing the fabrication equipment to:
    deposit a bottom anti-reflective coating (BARC) proximate to the etch stop layer;
    deposit a photoresist layer on the BARC;
    pattern the photoresist layer to form a patterned photoresist layer;
    etch openings in the BARC through the patterned photoresist layer; and
    etch portions of the etch stop layer through the openings in the BARC.

11. The non-transitory computer readable storage device of claim 10, wherein the data, when used by the fabrication equipment, further causing the fabrication equipment to ash the patterned photoresist layer and the BARC.

12. The apparatus of claim 1, wherein the etch stop layer corresponds to a barrier low k (BLOK) layer.

13. The apparatus of claim 12, wherein the etch stop layer includes silicon carbide, silicon carbide doped oxide (SiCO), silicon carbon nitride (SiCN), aluminum nitride (AlN), or a combination thereof.

14. The apparatus of claim 1, wherein the first opening is disposed between the second opening and the third opening.

15. The apparatus of claim 1, wherein the spacing between the first opening and the second opening is distinct from the spacing between the first opening and the third opening.

16. The apparatus of claim 1, wherein the via extends through the layer of material.

* * * * *